United States Patent [19]

Weinstock et al.

[11] Patent Number: 5,317,265
[45] Date of Patent: May 31, 1994

[54] COMPUTERIZED MAGNETIC RESONANCE ANALYZER

[76] Inventor: Ronald J. Weinstock, Sigrid Lipsett, 2083 Lindengrove St., Westlake Village, Ventura County, Calif. 91361

[21] Appl. No.: 945,529
[22] Filed: Sep. 16, 1992
[51] Int. Cl.⁵ .................................. G01R 33/20
[52] U.S. Cl. ............................ 324/312; 324/318
[58] Field of Search ............. 324/300, 318, 322, 314, 324/313, 301; 128/653.5

[56] References Cited

U.S. PATENT DOCUMENTS

| | | | |
|---|---|---|---|
| 3,609,317 | 9/1971 | Siebert | 324/312 |
| 3,824,452 | 7/1974 | Freeman et al. | 324/314 |
| 4,455,527 | 6/1984 | Singer | 324/316 |
| 4,593,246 | 6/1986 | Hill | 324/307 |
| 4,602,213 | 7/1986 | Sugiura | 324/307 |
| 4,654,597 | 3/1987 | Hino | 324/322 |
| 4,656,425 | 4/1987 | Tsur et al. | 324/309 |
| 4,694,254 | 9/1987 | Vatis et al. | 324/314 |
| 4,739,268 | 4/1988 | Fox | 324/314 |
| 4,740,750 | 4/1988 | Machida | 324/312 |
| 5,053,709 | 10/1991 | Mitomi | 324/309 |
| 5,072,732 | 12/1991 | Rapoport et al. | 324/308 |
| 5,208,537 | 5/1993 | Rietsch et al. | 324/322 |

Primary Examiner—Michael J. Tokar
Assistant Examiner—Raymond Y. Mah
Attorney, Agent, or Firm—Morrison & Foerster

[57] ABSTRACT

The magnetic resonance signal analyzer allows to generate a large variety of test signals including one or more frequencies. The test signals can be applied as electromagnetic fields or as currents to material under test. An electromagnetic or electrical response signal of the material under test be applied to the analyzer for processing to determine the response pattern of the material under test.

6 Claims, 1 Drawing Sheet

COMPUTERIZED MAGNETIC RESONANCE ANALYZER

BACKGROUND OF THE INVENTION

The apparatus of the present invention relates to magnetic resonance test instrumentation. It exposes material to be tested to an electro-magnetic field of selected frequencies and analyzes the magnetic resonance responses of the material. The magnetic resonance analyzer offers new advantages in the field of material analysis. It has been shown that the applicability of such an analyzer exceeds the range of tissue analysis and other medical applications. The magnetic resonance analyzer measures the degree and type of response of a matter under test, and by comparison with reference matter it assists in recognizing deviations from the desired response. This capability is enhanced by testing with a test pattern which relates to the significant characteristics for the particular matter under test.

SHORT DESCRIPTION OF THE INVENTION

The apparatus of the present invention includes the means for selecting test patterns and means for generating a selected test pattern. Two methods of subjecting a matter under test to the test pattern signals are provided. A first method uses an inductive coil for generating an electromagnetic field under control of test pattern signal and a sensor for electromagnetic fields for sensing the response. The second method uses probes for electrical signals, causing electrical currents between input probes. Test probes are used to sense currents at selected locations of the matter under test to evaluated the response of the matter under test.

The sensed analog response signals are processed in a first analog signal processing circuit and may generate a linear signal indicative for deviations from an expectant result. A second analog processing circuit performs a conversion from analog to digital representation of the response signal for evaluation in digital data processing means. Additional external equipment may be connected at suitable locations for evaluating a signal using commercially available equipment, such a spectrum analyzers etc.

The inductive coil for generating the electromagnetic fiels and the sensor coil can be combined in various configuration for testing particular matter. While both coils can be concentric in many applications, it has been found that in some applications specially shaped coils such as conically formed coils are more suitable to subject the matter under test to the electromagnetic field.

DESCRIPTION OF THE PREFERRED EMBODIMENT

Figure 1:
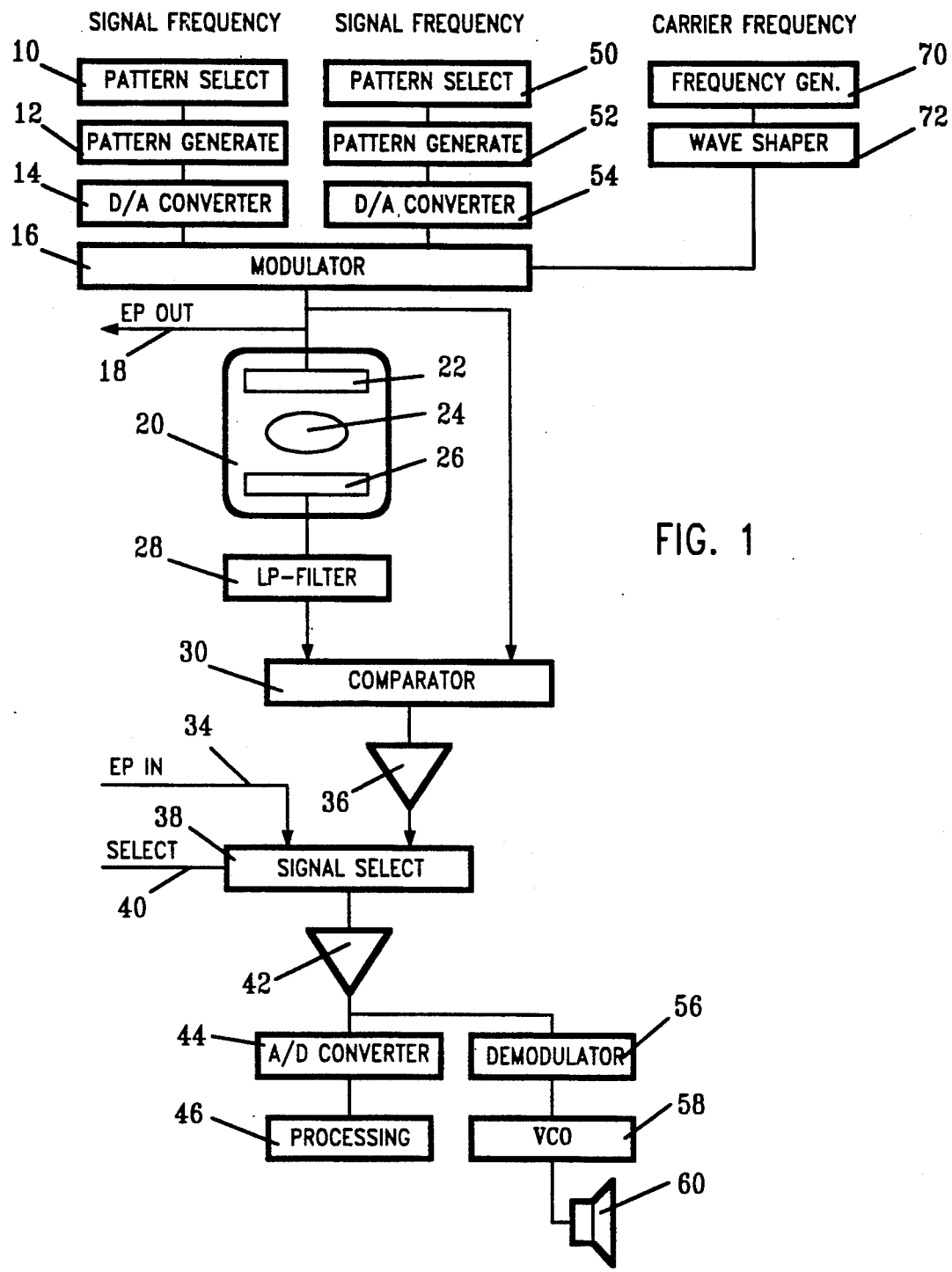
FIG. 1 is a schematic block diagram of the magnetic resonance analyzer of the present invention.

The apparatus of the present invention can be used in various ways to test matter. In the following description of the preferred embodiment the test is performed in a chamber in which the matter under test is subjected to an electromagnetic field generated by a primary coil. A secondary coil is used to sense the sum of the test field and the response field. Primary and secondary coils may be concentric and the secondary coil may be located inside the primary coil. Both coils may be electromagnetically shielded to eliminate any influence from an external electromagnetic field.

The apparatus of the present invention has two signal frequency generators and a carrier frequency generator. The two frequency generators include the same type of major components: pattern select means 10 and 50, respectively, pattern generator 12 and 52, respectively, and digital to analog converters 14 and 54 respectively. The inputs of the digital-to-analog converters receive a sequence of binary coded values which are converted into analog signals. The resultant analog signals contain the frequencies which will cause a resonance response by the matter under test. The two analog signals are supplied to modulator 16. The carrier frequency generator 70 provides a selected frequency signal. The output signal of generator 70 is fed through a wave shaper 72 and drives the carrier input 74 of modulator 16. The output of modulator 16 provides the test pattern signal in which the carrier frequency pattern is modulated by the selected signal frequency pattern. The frequency spectrum of the test patterns reaches from 3 Hz to 14 KHz. In FIG. 1 there is provided a separate output EP OUT 18 which makes the test signal available to external probes.

Using test chamber 20 of the apparatus the test pattern signal is supplied to a primary excitation coil 22, which generates the electro-magnetic test field. The matter to be test 24 is placed inside coil 22. A secondary coil 26 senses the resultant electromagnetic field inside test chamber 20. The electrical output signal of secondary coil 26 includes a component from the test pattern field and a component representing the resonance signal of the matter under test responding to the test field. A low-pass filter 28 eliminates all frequency components above a certain frequency. The resultant filtered signal is compared with the electrical test pattern signal in comparator 30. The difference signal is amplified in amplifier 36 and supplied to an electronic switch 38. Switch 38 is provided to select either an external signal EP IN from an external device connected to line 34, or the filtered differential signal from amplifier 36. Switch 38 is controlled by a select signal on line 40. The selected signal is amplified in amplifier 42 and provided to two evaluation channels. The first evaluation channel converts the received signal into a digital signal in D/A converter 44. The resultant digital signal can be evaluated, processed, stored, modified or treated otherwise in an processing device 46, such as a special or common purpose computer. The second evaluation channel includes a demodulator 56, a voltage controlled oscillator 58 and an acoustic output device, such as a loudspeaker.

The magnetic resonance analyzer can generate a large variety of signal patterns. For testing a particular matter the optimum test pattern has to be determined which is significant to the particular matter. When testing a sample at a later time, a so determined optimum test pattern is selected and imposed on the sample under test. The resultant resonance spectrum can be compared with the expected resultant test pattern and the user may draw a conclusions from the differences. Important features of the resultant signals are the resonance responses and the frequencies showing extraordinary peak emissions.

The resonance frequency analyzer of the present invention can be equipped with different types of primary and secondary coils depending upon the material and its shape to be tested. In a similar fashion the test signal can be supplied via output EP OUT 18 to input test probes which are inserted or attached to the material under test thereby causing an electrical current to flow between the input probes. Output sense probes can be inserted or attached at other locations of the material under test to identify the reaction of the material under test to the test signal. The output sense probes are to be connected to input EP IN 34. The detected signal is processed in the same manner as the signal from the secondary coil of the test chamber.

What is claimed is:

1. An apparatus for providing a magnetic resonance signal for a matter under test comprising first means for generating a first electrical signal; second means for generating a second electrical signal; modulating means for modulating said second signal with said first signal and providing a third electrical signal;

said third signal having a frequency spectrum between 3 Hz and 14 kHz, first inductor means for generating an electro-magnetic field controlled by said third electrical pattern signal, said first inductor means being adapted to subject said matter under test to said electro magnetic field; second inductor means for sensing an electromagnetic field in close proximity to said matter under test and providing a fourth electrical signal, said fourth electrical signal being indicative for the electromagnetic field generated by said first inductor means and said magnetic resonance signal of said matter under test; means for comparing said third electrical signal with said fourth electrical signal and providing a first difference signal, said first difference signal being indicative of the magnetic resonance characteristic of said matter under test; means for analyzing said difference signal.

2. An apparatus as claimed in claim 1 wherein said means for analyzing said difference signal includes means for converting said difference signal to a digital signal, and means for performing data processing operation on said digital signal.

3. An apparatus as claimed in claim 1 wherein said means for analyzing said difference signal includes means for demodulating said difference signal and providing a DC signal representative for the amplitude of said difference signal; and means for generating an audible signal including a voltage controlled oscillator and an audible tone generator.

4. An apparatus as claimed in claim 1, said apparatus further including output means for providing said third electrical signal to a device external to said apparatus, and input means for providing a second difference signal from said device external to said apparatus, and switch means for selectively feeding either said first difference signal or said second difference signal to said means for analyzing said difference signal.

5. An apparatus as claimed in claim 1 wherein said first inductor is a first wire coil, and said second inductor is a second wire coil inside said first wire coil and said matter under test is located inside said second wire coil.

6. An apparatus as claimed in claim 5 wherein an output means includes first electrical test probes for applying an electrical test signal to said matter under test, an input means includes second electrical test probes for sensing an electrical response signal from said matter under test.

* * * * *